(12) United States Patent
Bodan et al.

(10) Patent No.: US 9,583,520 B2
(45) Date of Patent: Feb. 28, 2017

(54) OPTIMIZING GEOMETRIC FILL FACTOR IN PRISM-COUPLED WAVEGUIDE-FED SOLAR COLLECTOR

(71) Applicant: AMI Research & Development, LLC, Windham, NH (US)

(72) Inventors: Patricia Bodan, Amherst, NH (US); John T. Apostolos, Lyndeborough, NH (US); William Mouyos, Windham, NH (US)

(73) Assignee: R.A. Miller Industries, Inc., Grand Haven, MI (US)

( * ) Notice: Subject to any disclaimer, the term of this patent is extended or adjusted under 35 U.S.C. 154(b) by 0 days.

(21) Appl. No.: 14/017,466

(22) Filed: Sep. 4, 2013

(65) Prior Publication Data

US 2014/0167195 A1    Jun. 19, 2014

Related U.S. Application Data

(60) Provisional application No. 61/697,027, filed on Sep. 5, 2012.

(51) Int. Cl.
| | |
|---|---|
| *H01L 27/144* | (2006.01) |
| *H01L 31/0232* | (2014.01) |
| *H01L 31/054* | (2014.01) |

(52) U.S. Cl.
CPC .......... *H01L 27/144* (2013.01); *H01L 31/054* (2014.12); *H01L 31/0547* (2014.12); *H01L 31/0549* (2014.12); *Y02E 10/52* (2013.01)

(58) Field of Classification Search
CPC ............... H01L 31/0528; H01L 31/054; H01L 31/0549; H01L 31/046; H01L 27/144; H01L 31/055; H01L 31/02322; H01L 31/0524; H01L 31/0547; H01L 31/059; G02B 19/0042; G01J 1/0477; H02S 40/20; H02S 40/22

See application file for complete search history.

(56) References Cited

U.S. PATENT DOCUMENTS

| | | | | |
|---|---|---|---|---|
| 3,990,037 | A * | 11/1976 | Carlo | 365/10 |
| 4,545,642 | A * | 10/1985 | Auracher et al. | 385/36 |
| 5,125,740 | A * | 6/1992 | Sato et al. | 356/128 |
| 5,652,816 | A * | 7/1997 | Minami et al. | 385/31 |
| 6,625,349 | B2 * | 9/2003 | Zhao | G02B 6/12007 385/15 |
| 8,324,499 | B2 | 12/2012 | Moslehi | |

(Continued)

FOREIGN PATENT DOCUMENTS

EP    2 348 342 A1    7/2011

OTHER PUBLICATIONS

Gorin, et al, "Fabrication of silicon nitride waveguides for visible-light using PECVD: a study of the effect of plasma frequency on optical properties" Optics Express, 2008, p. 13509-13516.*

(Continued)

*Primary Examiner* — Marla D McConnell
(74) *Attorney, Agent, or Firm* — McGarry Bair PC

(57) ABSTRACT

A prism coupled waveguide-fed solar collector array optimized for geometric fill factor. An integrated linear array of prisms is arranged with their input faces in a common plane. The exit faces of the prisms each feds a corresponding optical waveguide and detector.

14 Claims, 4 Drawing Sheets

(56) References Cited

U.S. PATENT DOCUMENTS

| | | | |
|---|---|---|---|
| 2003/0206681 A1* | 11/2003 | Polonskiy et al. | 385/15 |
| 2006/0290899 A1* | 12/2006 | Davis | G03B 21/28 |
| | | | 353/81 |
| 2009/0255568 A1* | 10/2009 | Morgan | F24J 2/062 |
| | | | 136/246 |
| 2010/0126577 A1 | 5/2010 | Wu et al. | |
| 2010/0126584 A1* | 5/2010 | Seol et al. | 136/259 |
| 2010/0278480 A1 | 11/2010 | Vasylyev | |
| 2012/0205525 A1 | 8/2012 | Apostolos et al. | |
| 2013/0167904 A1 | 7/2013 | Moslehi | |

OTHER PUBLICATIONS

Tangonan, et al "Tapered gap prism couplers for high index materials" Applied Optics, 1977, p. 1795-1796.*

Introduction to Organic Electronic and Optoelectronic Materials and Devices, edited by Sun, p. 826, CRC press, 2008.*

Zhao, Lu "High Efficiency Mechanically Stacked Multi-junction Solar Cells for Concentrator Photovoltaics," Katholieke Universiteit Leuven Facultiet Ingenieurswetenschappen Department Elektrotechniek (ESAT) Afdeling Insys, Kasteelpark Arenberg 10-B-3001 Heverlee, Belgie, Mar. 2011, 235 pages.

Kupec et al, "Light absorption and emission in nanowire array solar cells," Optics Express 27589, Dec. 20, 2010, vol. 18, No. 26, 17 pages.

Lloyd, H, "A Treatise on Light and Vision", Chapter 3—Refraction by Prisms., p. 87, London 1831.

* cited by examiner

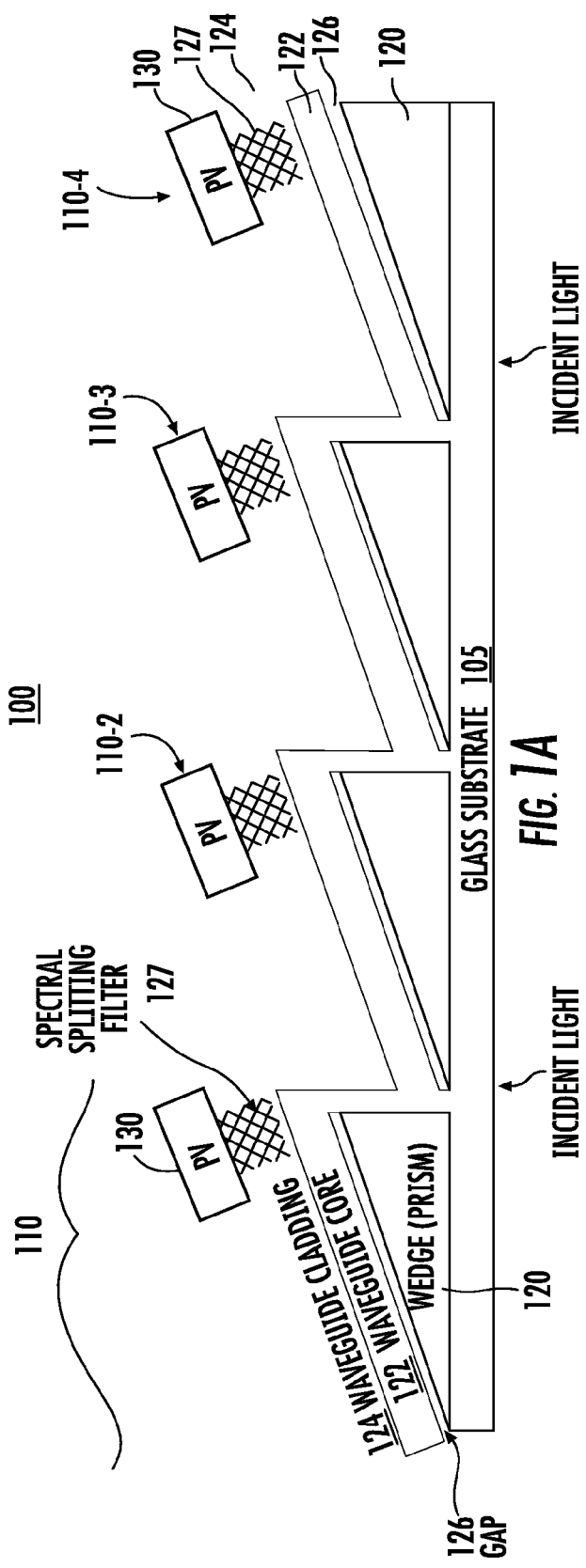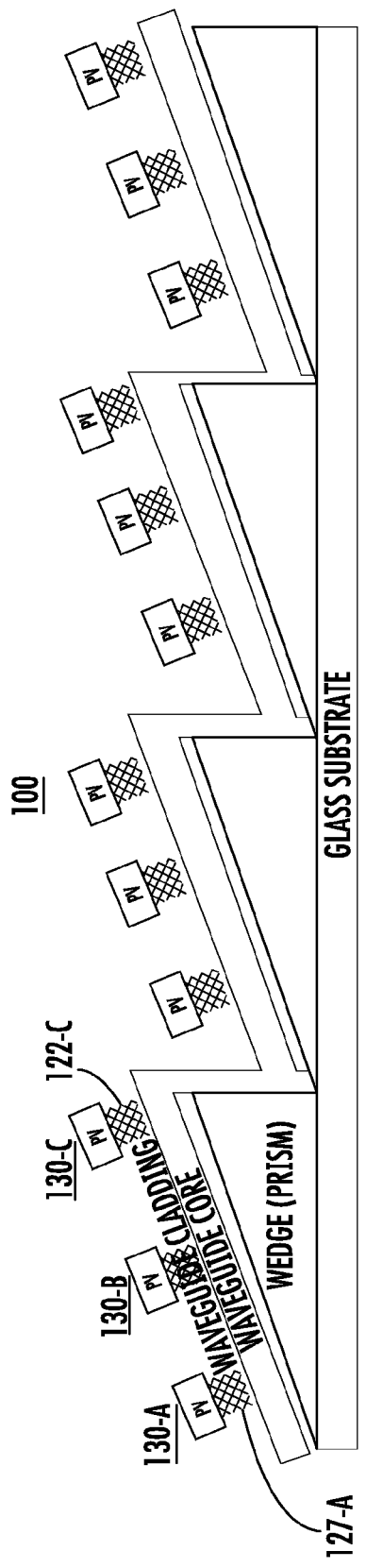
FIG. 1A
FIG. 1B

OPTIMIZING GEOMETRIC FILL FACTOR IN PRISM-COUPLED WAVEGUIDE-FED SOLAR COLLECTOR

CROSS-REFERENCE TO RELATED APPLICATIONS

The present application claims the benefit of U.S. Provisional Patent Application Ser. No. 61/697,027, which was filed on Sep. 5, 2012, by Patricia Bodan et al. for a OPTIMIZING GEOMETRIC FILL FACTOR IN PRISM-COUPLED WAVEGUIDE-FED SOLAR COLLECTOR and is hereby incorporated by reference.

BACKGROUND

Technical Field

This application relates generally to solar collectors, and more particularly to optimization of geometric fill factor in a solar collector that is fed via prism-coupled optical waveguide(s).

Background Information

A Monolithic Thin Film Concentrating (MTFC) Solar Collector with an option for Spatially Separated Photovoltaic (PV) Devices has the potential to provide improved efficiency, while lowering the manufacturing cost over conventional solar concentrating systems. The monolithic structure is divided into three (3) major areas: 1) a uniform leaky-wave solar antenna, 2) a waveguide and 3) a PV device region. Here, the PV can be any combination of photovoltaic optical to electrical converting device such as a semiconductor or an antenna-coupled metal insulator metal (MIM) device(s). This entire structure lends itself to fabrication using thin film processes typical in the semiconductor industry that produce Complementary Metal Oxide Semiconductor (CMOS) circuits. Processes such as Metal Oxide Vapor Chemical Deposition (MOVCD), Plasma-Enhanced Chemical Vapor Deposition (PECVD) and Reactive Ion Etching (RIE) are well suited to cost-leverage by high volume production.

More details of such a device are provided in a co-pending U.S. patent application Ser. No. 13/357,448 entitled "Leaky Wave Mode Solar Receiver" filed Jan. 24, 2012, the entire contents of which are herein incorporated by reference.

The discriminating features of this solar cell design come from the application of electromagnetic theory, similar to phased array antennas, to the light propagation. The sun's energy is concentrated using a wide-band uniform leaky-wave solar "antenna" that couples the energy into a planar waveguide. Optical coating filters within the waveguide, direct the spectral energy bands into photovoltaic devices, each having a band-gap optimized to the wavelength of energy incident on each of them. The unique features of this arrangement are; the uniform leaky-wave antenna region is broadband, collecting the entire solar spectrum. The capture area of the antenna has a wide field of view in one (1) plane which eliminates the need for 2-axis tracking. Tracking in the single axis is accomplished by electro-mechanical means with the use of MEMS actuators to physically tilt the sub-arrays, conventional solar trackers, or by controlling the propagation constant in the traveling wave array structure with piezoelectric actuators which adjust the phase progression on the antenna and allows for beam steering without physically tilting the array.

The waveguide structure is designed to be optimized for the solar spectrum and coherently directs energy to the photovoltaic region. One aspect to lowering the cost is in using multiple, spatially separated photovoltaic devices. By separating the devices, the costs, design constraints and inefficiencies associated with lattice matching and tunnel diode junctions are eliminated. Furthermore, this structure takes advantage of the strengths of Concentrated PV (CPV) approaches, such as higher efficiencies of PV devices under concentration, and the reduction of PV material, while reducing the major costs involved in CPV systems such as the high cost of optics, trackers, and tandem multi-junction PV cells. By applying a systems engineering approach, all the key components are integrated into the monolithic architecture to yield a system that reduces the cost of generating solar power through an increase in efficiency while lowering manufacturing costs.

SUMMARY

The concentrated photovoltaics (CPV) of today utilize either single junction silicon cells under low concentration (2-10x) or multi-junction cells under high concentration (300-500x). With the declining cost of silicon, and the substantial amount of spectral energy lost to heat, the use of silicon in a concentrating system is no longer advantageous. Higher concentration systems employing multi-junctions typically have two (2) lenses, a primary lens and a secondary lens to achieve high concentration. These systems with large optics require two-axis trackers that typically use hydraulic drive motors. These large and heavy panels have high operating costs, reliability concerns and an overall high Life Cycle Cost (LCC).

An improvement over known techniques is provided by a Monolithic Thin Film Concentrating Solar Collector with Spatially Separated Photovoltaic Devices with a specific arrangement of the leaky mode solar antenna structures. The core of the approach is at the solar cell level. The monolithic structure of the cell creates a module that is lightweight, has a low profile and is spectrally optimized for increased efficiency.

The apparatus consists of a monolithic, integrated array of solar collector elements, where each element includes the following:

a simple geometric optical wedge or section of a wedge (also called a "prism" herein) used as a solar antenna for uniform leaky-wave input coupling and concentration;

a corresponding optical waveguide or section of a waveguide, into which light energy collected by the prism is coupled;

the prism and waveguide further providing the option for spectral decomposition of received optical energy, allowing the use of multiple band-gap optimized materials without tunnel diode junctions and lattice matching constraints of tandem multi-junction PV's; and resultant evanescent longitudinal coupling or redirected butt coupling of optical energy into the spatially separated photovoltaic cells.

The element array is arranged to provide optimum geometric fill factor by aligning the input faces of the prisms with one another in a common plane and using a prism angle optimized for the prism and waveguide materials.

BRIEF DESCRIPTION OF THE DRAWINGS

The description below refers to the accompanying drawings, of which:

FIG. 1A is one embodiment of a prism-coupled optical waveguide array;

FIG. 1B is another embodiment with multiple photovoltaic regions adjacent each waveguide;

DETAILED DESCRIPTION OF ILLUSTRATIVE EMBODIMENTS

Figure 2:
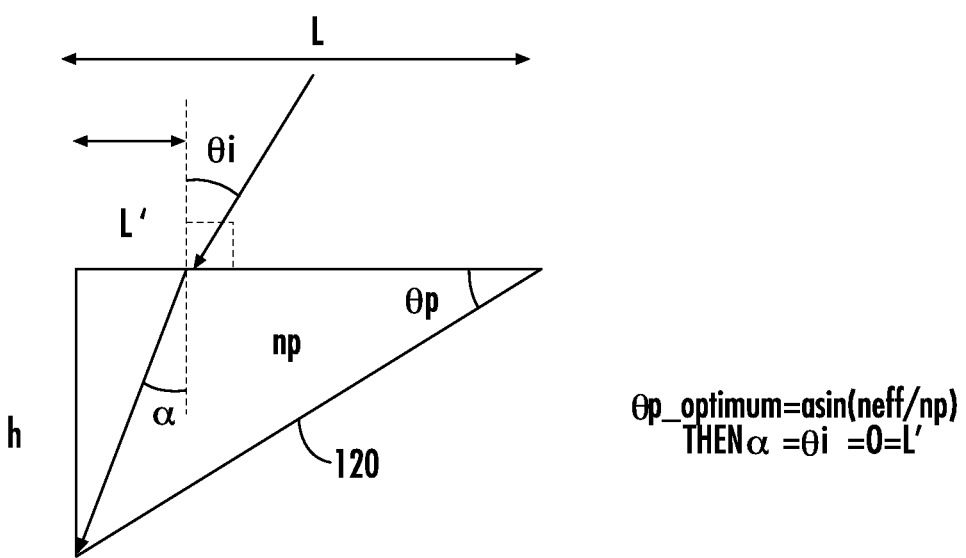
FIG. 2 illustrates the geometry used in the fill factor calculation of Equation 1.

A prism-coupled optical waveguide-fed photodetector array constructed according to the teachings herein allows an incoming plane wave to be detected into a set of output currents. Each current is proportional to the length of the prism or wedge, and the optical flux density impinging upon the wedge. The level of light concentration onto the solar detector(s) is approximately equal to the length of the wedge base divided by the length of the coupling. Each prism—waveguide element acts as an extremely small F-number lens, that is not achievable with standard lens (focal length), detector geometry. This allows the system to have better concentration than lens based diffraction limited systems.

Shown in FIG. 1A is an example of one such structure. This example includes an array 100 formed of four (4) elements 110-1, 110-2, 110-3, 110-4. Each element 110 in the array 100 includes a wedge (prism) 120 disposed on a substrate 105. As shown, the prisms 120 in each element 110 are aligned on a substrate 105 (which may be a glass substrate), such that their entrance faces lie in a common plane adjacent the glass substrate 105. A waveguide core 122 and waveguide cladding 124 are deposited on the prism 120. One or more photovoltaic detectors 130 are associated with each element 110. An optional spectral splitting filter 127 may be placed between the waveguide core 122 (aligned with waveguide cladding 124) and the corresponding PV 130.

In a preferred arrangement, the following materials are used for wedge 120, waveguide core 122, and waveguide cladding 124 (and their corresponding indicies of refraction): titanium dioxide (TiO2) (np=2.3), benzocyclobutene (BCB) (or Si3N4) (n=1.6 to 2.0), and silicon dioxide (SiO2) (n=1.47).

A gap layer, optionally shown tapered, 126 (SiO2, n=1.47 may be placed between the waveguide core 122 and prism 120. The gap layer 126 serves to provide a coupling mechanism to the waveguide and equalize the amplitude distribution across the prism 120 to waveguide 122 coupling region.

Instead of having a waveguide 122 with a constant index of refraction it is possible to provide a waveguide with an index that tapers along its length (not shown). This eliminates the need for the gap layer 126 to be tapered.

FIG. 1B is another implementation having multiple PVs 130-A, 130-B, 130-C and corresponding spectral filters 127-A, 127-B, 127-C disposed along the length of waveguide 122.

In operation, light enters glass substrate 105 and then the prisms 120 at an base or entrance (input) face, travels through the prisms 120, exiting from a prism exit face. In this embodiment, the third face of the prisms is disposed at right angles with respect to the base. Light exits the prism 120 and is collected by the waveguide, which concentrates light near the PV 130 region(s). The optional spectral splitting filter(s) 127 serves to further direct light to the PVs 130.

FIG. 2 shows the prism in more detail and defining geometry. The total geometric fill factor of such a prism coupled solar array 100 is comprised of two (2) parts—the usable surface area of each prism and the usable area of the surface normal to the incoming solar energy. For a given set of waveguide materials and hence effective index of refraction of the waveguide (neff) and prism index (np), there is a prism angle that allows normal incident light at angle $\theta_i$ to be coupled into the waveguide. This prism angle is the arcsin of neff/np, and then $\theta i=0°$, optimizing the usable surface area of each prism. This arrangement will optimize the array geometric fill factor (GFF).

Figure 3:
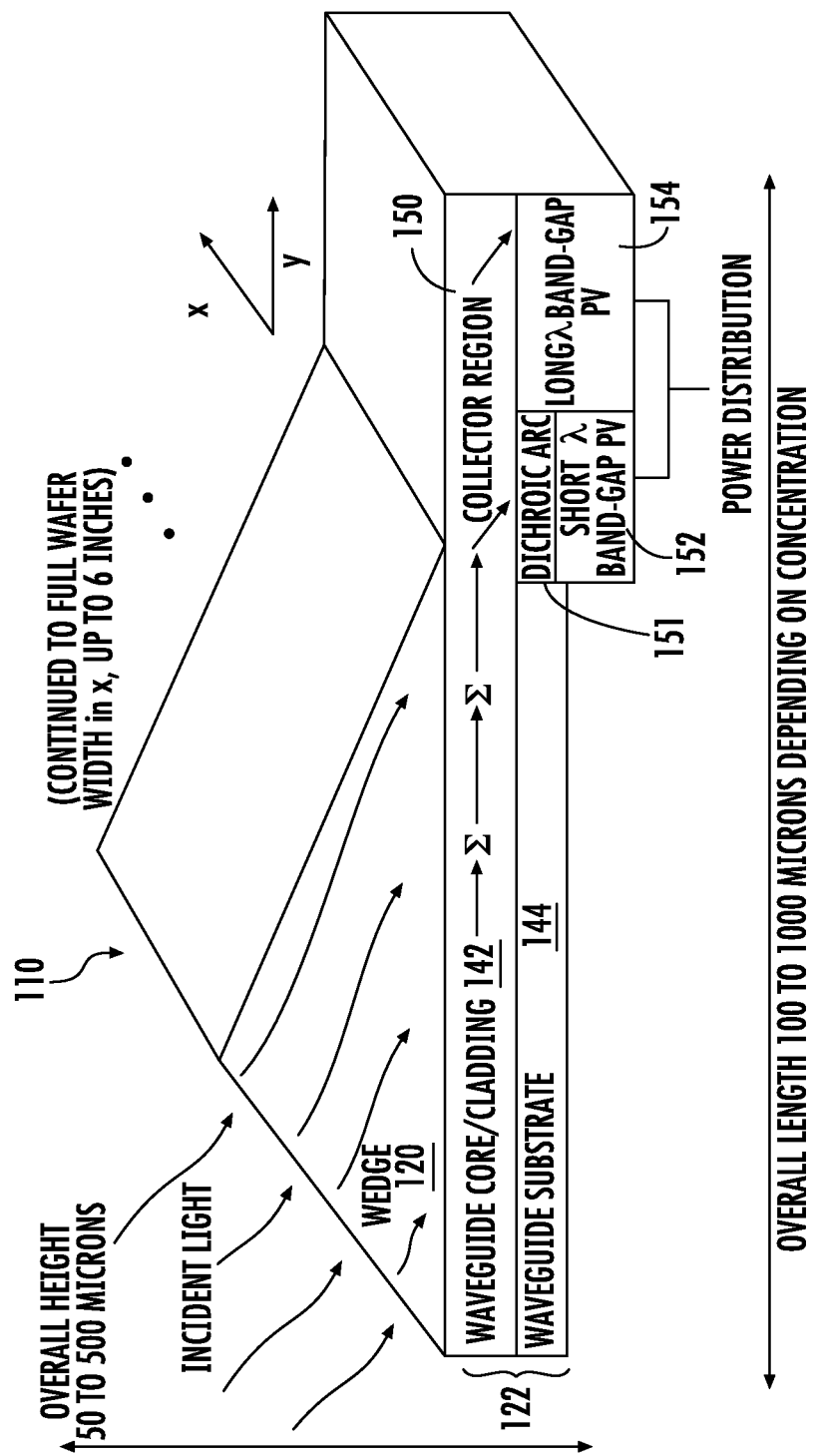
FIG. 3 is a notional cross-sectional block diagram of integrated concentration monolithic solar cell.

The block diagram in FIG. 3 shows a cross-sectional area of an example MTFC solar cell 110 in another embodiment, where the third edge of the prism forms an acute angle with respect to the base of the prism. It should be understood that the configuration in FIG. 2 is otherwise quite the same as that of FIG. 1A, albeit with the cell element 110 viewed from another angle (e.g., with the waveguide viewed horizontally). The components of each array element 110 are now described in more detail with reference to FIG. 3.

Wedge (prism) 120—The wedge serves the role of an achromatic lens by coupling light into the optical waveguide/classing 142 through leaky-wave propagation. It has been verified through modeling and simulation that an optimized coupling layer between the wedge and waveguide can approach a theoretically estimated 96% transmission efficiency over a wide bandwidth, in our models, with greater than 95% collection efficiency from 400 to 650 nm, and greater than 93% efficiency from 650 to 1200 nm is achieved. Current wedge prototypes used in a proof of concept test are TiO2 and gadolinium gallium garnet (GGG), but ultimately a monolithic deposited material is anticipated. As shown in FIG. 3, the triangular wedge 120 may again have an input face at which indicent light is received, an output face from which light exits towards the waveguide 142, and an opposite (third) face.

Waveguide 122—The waveguide confines the incident light to achieve coherent concentration. The model of our baseline design for the waveguide shows negligible loss over the coupling distance (0.1 dB/cm) to the photovoltaic cell(s). Once coupled into the waveguide, optical energy travels within the waveguide core 142 (deposited on a waveguide substrate 144), and its amplitude increases due to the input of additional energy through leaky-wave propagation from the higher-index wedge. When the energy reaches the photovoltaic cell(s) adjacent the collector region 150 it is coupled evanescently to each PV cell 152, 154 along the length of the cell until it is fully absorbed. At the far right end of the waveguide, optical energy is concentrated by a factor that is nominally the ratio of the wedge input to the coupling length of the evanescent wave along the photovoltaic cell. Current waveguide prototypes are made up of varieties of silicon-oxy-nitride layers deposited on a silicon substrate. More details of possible arrangements for the waveguide are described in the patent application that was incorporated by reference above.

Coupling Gap Layer 126—One of the keys to achieving efficient optical transmission is the wedge 120 to waveguide 122 coupling provided by tapered gap layer 126 (FIG. 1A). A low-index material is preferred as it controls leaky-wave propagation. It is optimized for efficient propagation within the core and efficient leaky-wave coupling from the wedge to the waveguide. Current prototypes are made up of a silicon-dioxide or Magnesium Fluoride coupling gap.

Photovoltaic Region 130—This region can either have spatially separated band gap materials 152, 154 in series, a single band-gap photovoltaic or a stacked multi-junction photovoltaic. Spatially separated, band gap optimized, single junction cells such as those shown may be preferred in some configurations. Without the constraints of lattice matching, the number of cells is easily expandable to six (6) junctions. The specific embodiment shown in the block diagram of FIG. 3 shows two (2) bands of spectrally-separated photovoltaics. This concept of multi-band non-tandem cell architecture has been proposed by others, for example a mechanically stacked arrangement or a dichroic filter lens based system. To our knowledge, however, this is the first time that a transverse arrangement of evanescent light coupling has been undertaken, that does not have the mechanical sensitivities of optical and spectral alignment. The longitudinal evanescent coupling approach has been verified by simulation.

Dichroic Anti-Reflective Coating(s) 127—Each unique band-gap photovoltaic will have a low-pass dichroic multi-layer optical coating 151 that is designed to reject optical energy not in the band of interest for that PV, serving as a spectral splitting filter. Optical energy incident on the filter that is rejected continues down the waveguide until it reaches its optimum band-gap PV material.

Figure 4:
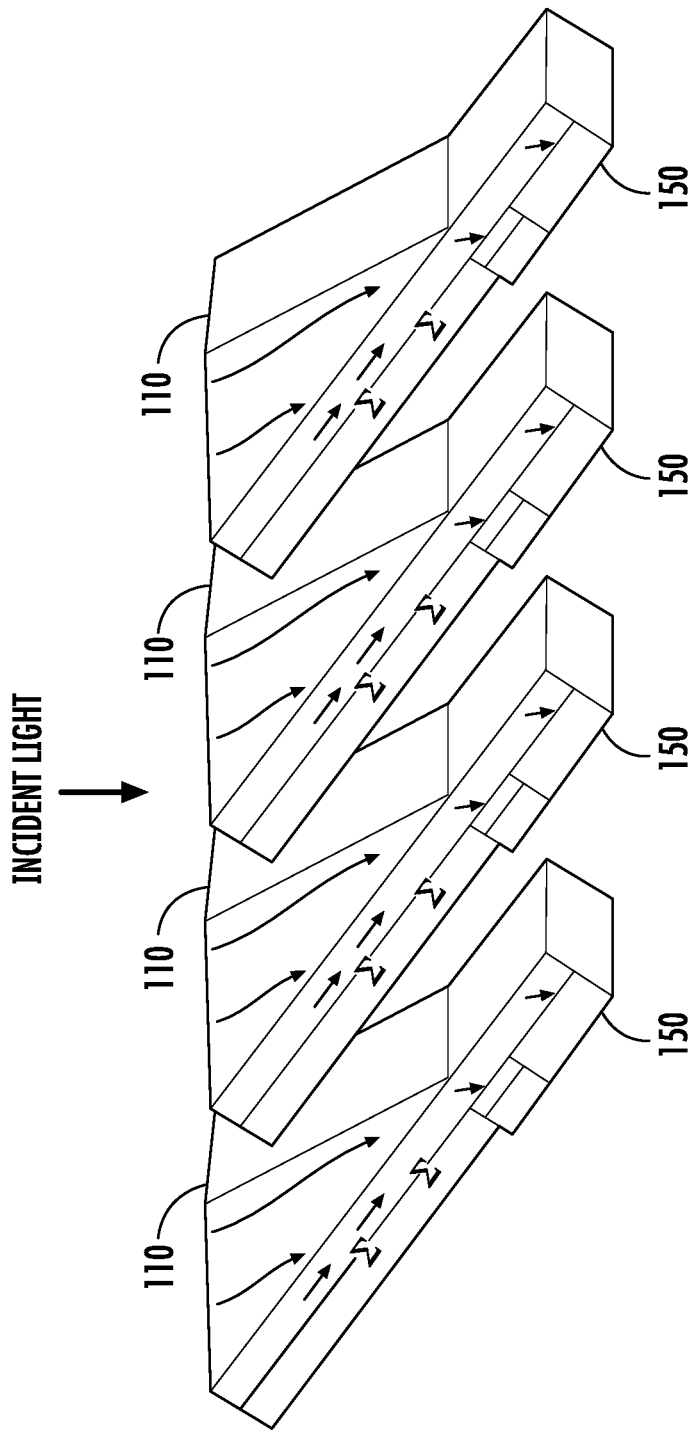
FIG. 4 is a three dimension exploded view of a system optimizing the geometric fill factor.

System: The cell arrangement in FIG. 4 optimizes the geometric fill factor associated with using the wedge. It should be understood that the view in this figure is an exploded view to better see the individual array elements 110.

The array consists of an integrated linear planar array of high index prisms on which waveguide layers are deposited. Each element of the array consists of a prism or wedge 120, and a slab waveguide 122 that terminates in a photodetector 130. The photodetector is coupled to the waveguide via a bonding layer (not shown).

Light that enters the wedge at the optimum input angle, such as determined by Snell's Law, is first coupled into the waveguide, and then evanescently coupled to the detector when the cladding layer thickness is reduced. Due to the planar alignment of the wedge (prism) bases and the resulting co-aligned input surface(s) used for the incoming light (and not the wedge hypotentuse), and assuming the individual elements can be abutted adjacent one another, the array has a optimal 100% fill factor for incoming light.

As with any CPV system, there is a necessity to track the sun. The system is concentrated in only the elevation direction, so it only requires tracking in one dimension. This is a fundamental advantage of the uniform leaky-wave antenna over all other types of optical concentrators. Due to the lightweight nature of the cells and panel, the tracking could be done at a panel level or at the cell level using miniature positioners. Tracking at the cell level can be accomplished by micro-electro-mechanical-system (MEMS) actuators to physically tilt the sub-arrays, or by controlling the propagation constant in the traveling wave array structure with piezoelectric actuators which adjust the phase progression on the antenna and allows for beam steering without physically tilting of the array. The latter allows the panel to be flush mounted on any flat surface without the necessity to rig the panel on top of a pylon for range of tracking. There are significant cost and reliability advantages to reducing the tracking load to a single axis.

Initial modeling has shown an overall cell-level efficiency of 42% assuming three (3) spatially separated, although not band gap optimized, PV junctions per element as well as assumed resistance losses.

What is claimed is:

1. An apparatus for collecting solar energy comprising a plurality of array elements, wherein each array element comprises:
   a single prism having a planar input face and a planar exit face;
   a waveguide disposed near to the planar exit face, such that the waveguide is evanescently coupled to the exit face of the prism;
   a taper layer disposed adjacent each waveguide, the taper layer arranged to equalize an amplitude distribution across the prism to the waveguide coupling; and
   at least one photodetector disposed adjacent each waveguide, wherein the plurality of array elements are arranged in a linear array and the entirety of each planar input face surface of each of the prisms of the plurality of array elements lie in a common plane.

2. The apparatus of claim 1 additionally wherein:
   two or more photodetectors are disposed adjacent each waveguide; and
   one or more spectral filters are disposed between each waveguide and at least one of the adjacent photodetectors.

3. The apparatus of claim 1 wherein each array element additionally comprises a waveguide cladding disposed on a side of the waveguides opposite the prism.

4. The apparatus of claim 3 wherein the material for the prism in each array element is selected as $TiO_2$, for the waveguide as benzocylobutene (BCB) or $Si_3N_4$, and for the waveguide cladding as $SiO_2$.

5. The apparatus of claim 3 wherein an index of refraction for the prisms is selected as np=2.3, for the waveguides as n=1.6 to 2.0, and for the waveguide cladding as n=1.47.

6. The apparatus of claim 1 wherein each array element additionally comprises a coupling gap disposed between the prism and the waveguide.

7. The apparatus of claim 1 wherein each waveguide additionally comprises a multilayer waveguide.

8. The apparatus of claim 1 wherein each prism further comprises a third planar face extending from the planar input face to the planar exit face.

9. The apparatus of claim 8 wherein the third planar face of each prism forms a right angle with respect to the planar input face of each prism.

10. The apparatus of claim 8 wherein the third planar face of each prism forms an acute angle with respect to the planar input face of each prism.

11. The apparatus of claim 1 wherein the planar input face of each prism is a flat surface that extends from a first edge to a second edge of each prism, and the array elements are further aligned such that the planar input faces, first edges, and second edges of all prisms lie in a common plane.

12. The apparatus of claim 1 wherein in each array element a prism angle, θp, between the planar input face and planar exit face is equal to arcsin (neff/np) where neff is an effective index of refraction of a material for the waveguide and np is an index of refraction of a material for the prism.

13. An apparatus for collecting solar energy comprising a plurality of array elements, wherein each array element comprises:
   a single prism having a planar input face and a planar exit face;
   a waveguide disposed near to the planar exit face, such that the waveguide is evanescently coupled to the exit face of the prism, and at least one photodetector disposed adjacent each waveguide, wherein the plurality of array elements are arranged in a linear array and the entirety of each planar input face surface of each of the prisms of the plurality of array elements lie in a common plane, each array element additionally having a waveguide cladding disposed on a side of the waveguides opposite the prism and the material for the prism in each array element is selected as $TiO_2$, for the waveguide as benzocylobutene (BCB) or $Si_3N_4$, and for the waveguide cladding as $SiO_2$.

14. The apparatus of claim 13 wherein an index of refraction for the prisms is selected as np=2.3, for the waveguides as n=1.6 to 2.0, and for the waveguide cladding as n=1.47.

* * * * *